United States Patent
Wu

(10) Patent No.: US 6,998,650 B1
(45) Date of Patent: Feb. 14, 2006

(54) REPLACEABLE LIGHT EMITTING DIODE MODULE

(76) Inventor: Jiahn-Chang Wu, No.15, Lane 13, Alley 439, Her-Chiang Street, Chutung, Hsin-Chu (TW) 310

( * ) Notice: Subject to any disclaimer, the term of this patent is extended or adjusted under 35 U.S.C. 154(b) by 0 days.

(21) Appl. No.: 11/082,131

(22) Filed: Mar. 17, 2005

(51) Int. Cl.
*H01L 33/00* (2006.01)
*H01L 23/34* (2006.01)

(52) U.S. Cl. ............ 257/100; 257/99; 257/81; 257/727; 361/640; 361/657; 361/667; 361/783; 361/787

(58) Field of Classification Search .......... 257/99, 257/100, 81, 727, E33.069, E33.058; 361/640, 361/657, 667, 783
See application file for complete search history.

(56) References Cited

U.S. PATENT DOCUMENTS

| | | | |
|---|---|---|---|
| 6,542,534 B1 * | 4/2003 | Svilans | 372/92 |
| 2003/0116838 A1 * | 6/2003 | Wu | 257/678 |
| 2005/0180157 A1 * | 8/2005 | Watanabe et al. | 362/543 |

\* cited by examiner

*Primary Examiner*—Jerome Jackson
*Assistant Examiner*—Joseph Nguyen
(74) *Attorney, Agent, or Firm*—H.C. Lin Patent Agent

(57) ABSTRACT

A clip is used to clamp a LED in place in a LED module. The clip has pliable conducting cover and can be latched to the upper lead metal of the LED module. The clip can be lifted for replacing a defective or color LED. A plurality of replaceable LEDs can be mounted a common metal substrate to form a display panel, and each LED can be clamped in position with clips straddling between parallel upper lead metal for electrical coupling to the top electrodes of the LED.

13 Claims, 9 Drawing Sheets

REPLACEABLE LIGHT EMITTING DIODE MODULE

BACKGROUND OF THE INVENTION

1. Field of the Invention

This invention relates to diodes such as light emitting diodes (LED) or vertical cavity surface emitting laser diodes, particularly a replaceable module for a light emitting diode.

2. Brief Description of Related Art

FIG. 1 shows a prior art module for mounting a LED as disclosed in USPTO Publication No. 2004/0227146. A LED 10 has a top electrode 101 and a bottom electrode 102. The LED 10 is clamped between an upper metal bracket 11, which is connected to the tops electrodes 101, and a lower metal plate 12, which is connected to the bottom electrode 102. The upper metal bracket 11 and the lower metal plate 12 are locked in place by a clamp (not shown), and are used as terminals for a surface mount module.

The drawback of such a structure is that it is inconvenient to replace a defective or different color LED in the module. To replace a LED, the clamp must be dismantled.

SUMMARY OF THE INVENTION

An object of this invention is to replace a defective LED in a LED module easily. Another object of this invention is to replace or install a different color LED in a LED module. Still another object of this invention is to form a pattern changeable LED display panel.

These objects are achieved by using a clip to clamp a LED in a module. The LED is held in place by a releasable clip. The clip has a thin pliable metallic cover, which contacts the upper electrode of the LED, and is latched to the upper metallic terminal of the module. The cover can easily be lifted for replacing a LED.

The same structure can also be used for a LED display panel, wherein each LED in the array can be replaced.

DETAILED DESCRIPTION OF THE INVENTION

Figure 1:
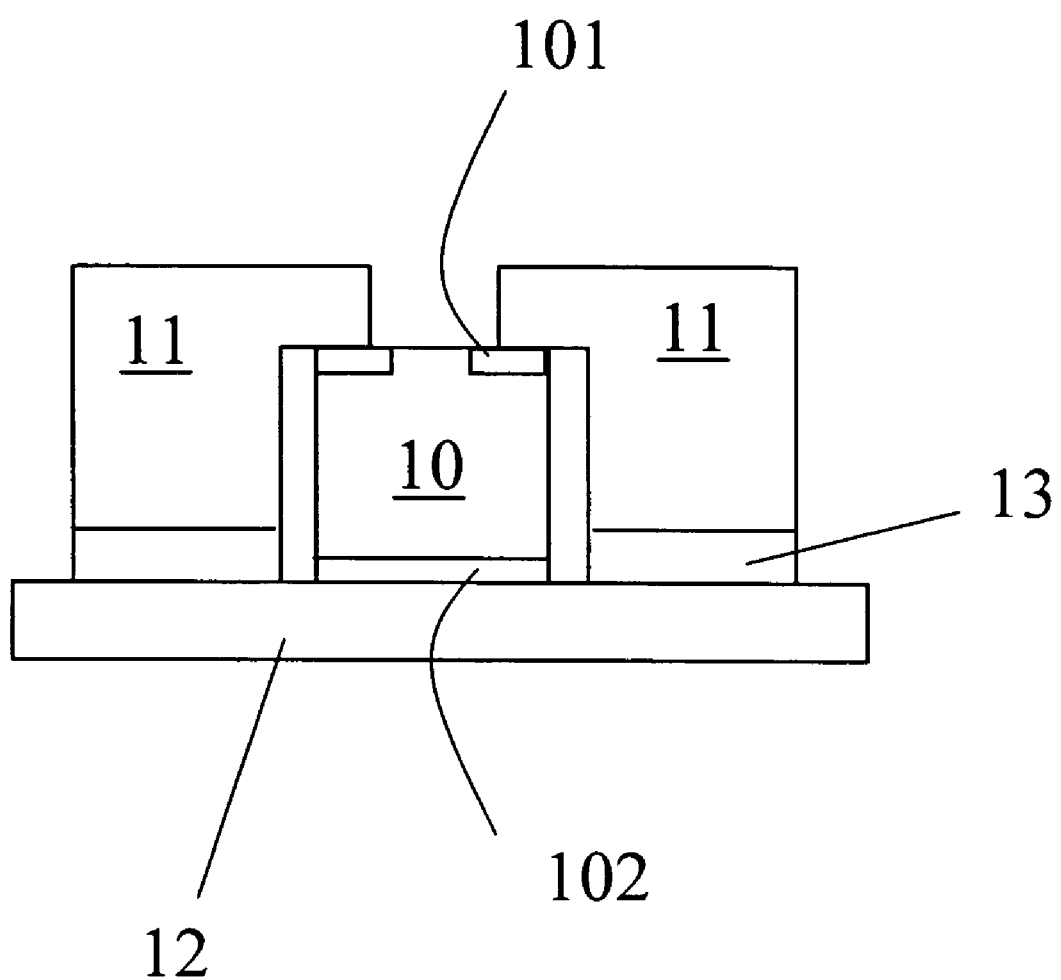
FIG. 1 shows a prior art LED module.
Figure 2:
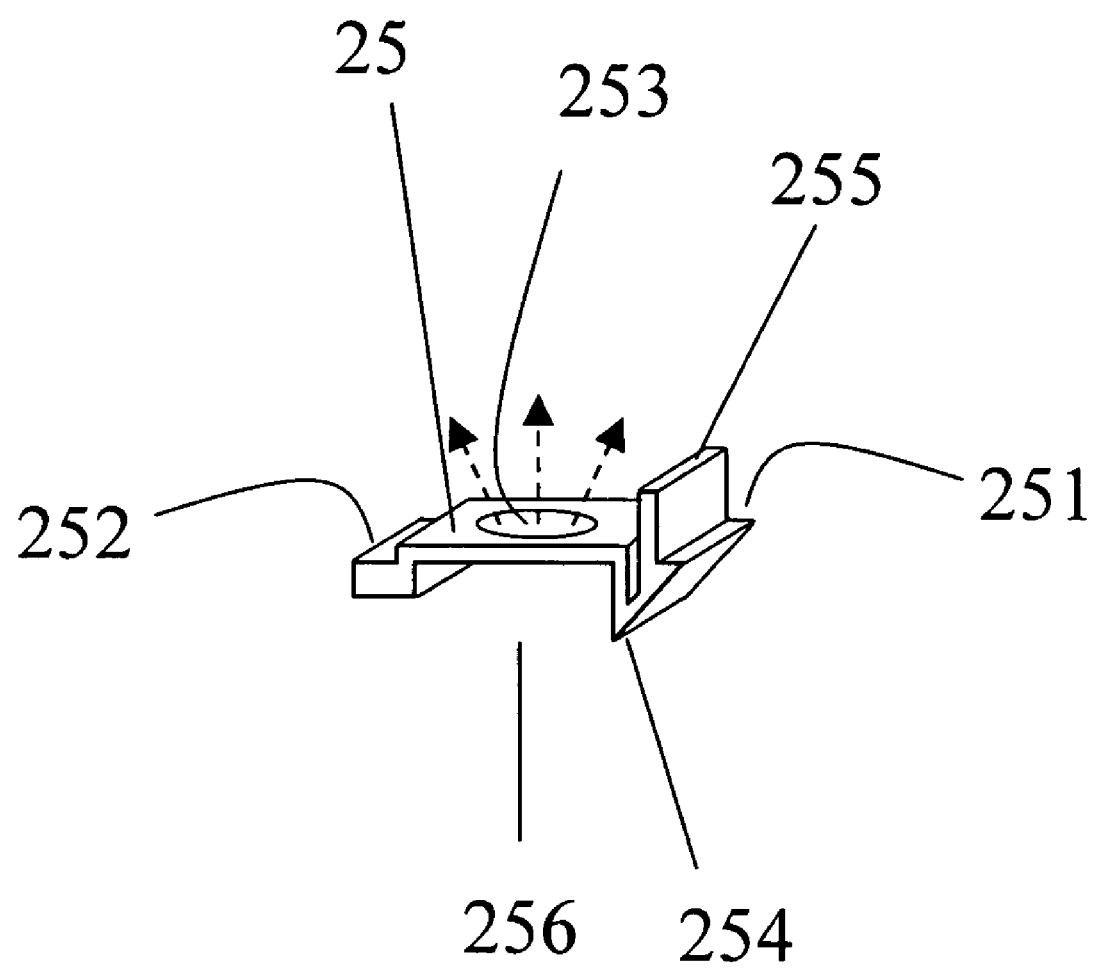
FIG. 2 shows the basic structure of the present invention with a pliable, releasable clip for covering the LED.
Figure 3:
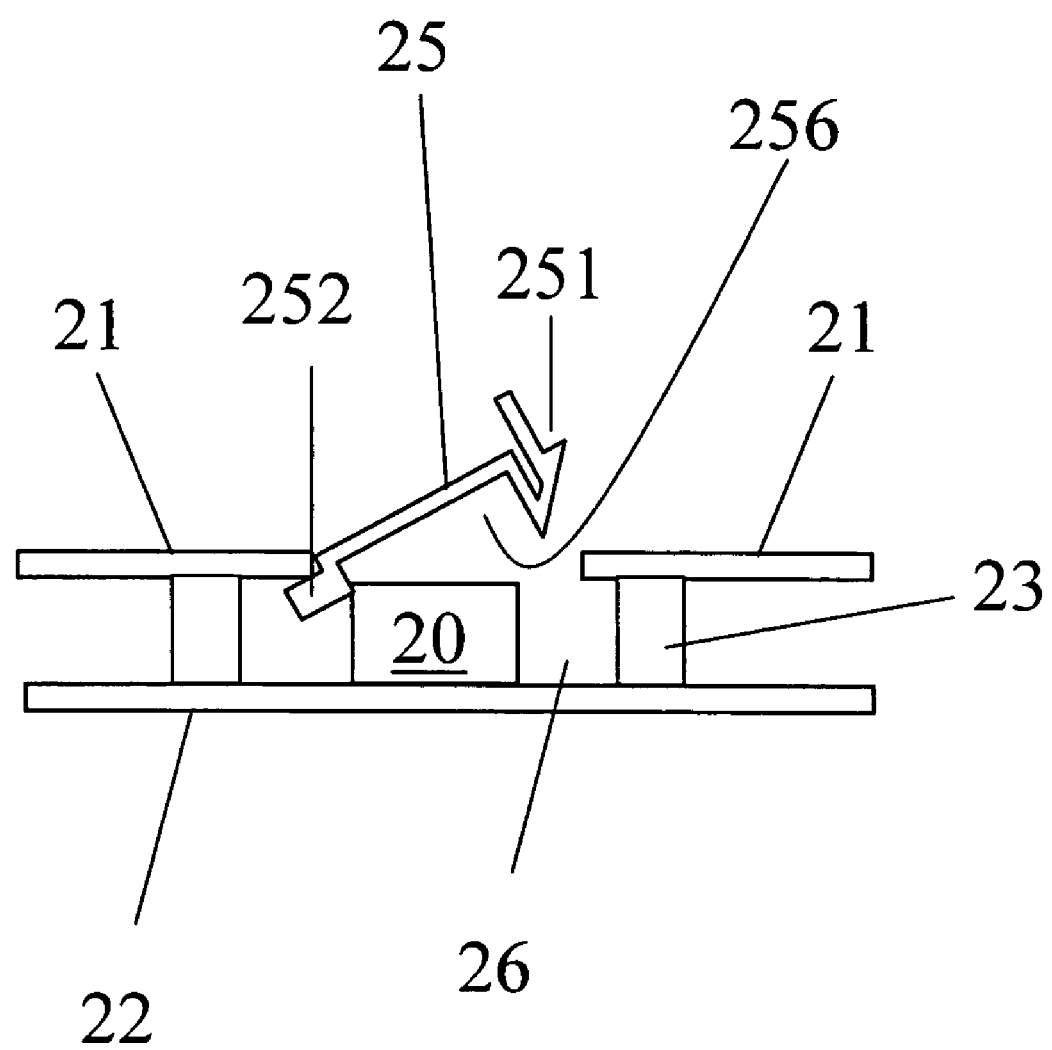
FIG. 3 shows the pliable cover of the clip before latching to the LED module.

FIG. 2 shows the basic structure of the present invention. A pliable metallic cover clip 25 with a window 253 is used as clip over a LED 20 as shown in FIG. 3. The cover has two flanges 251, 253 to form an inverted U-shaped groove 256. The flange 252 has a step. The flange 251 has a V-shaped cantilever 254 and a protruding handle 255 which forms a step with the flange 251. When the handle 255 is pressed toward the left side flange 252, the V-shaped cantilever 254 is compressed. The clip 25 has an inverted U-shaped bottom groove 256 for holding a LED 20. The LED 20 can be a semiconductor chip or a diode lamp.

FIG. 3 shows the installation of the clip 25 in a LED module. A LED 20 is mounted on a bottom metallic plate 22, which serves as terminal for a surface mount module for the LED. A top metallic plate 21, which serves as another terminal for the LED has an opening for the insertion of the clip 25, is supported by insulators 23 in the space 26 over the bottom metallic plate 22. The top plate 21 has a window over the LED 20 to allow light transmission from the LED 20. The clip 25 engages one edge of the window of plate 21 at the step of the flange 252. FIG. 3 shows the position of the clip 25 before latching to the top metallic plate 21 with the right side flange 251 dangling, and the LED 20 uncovered.

Figure 4:
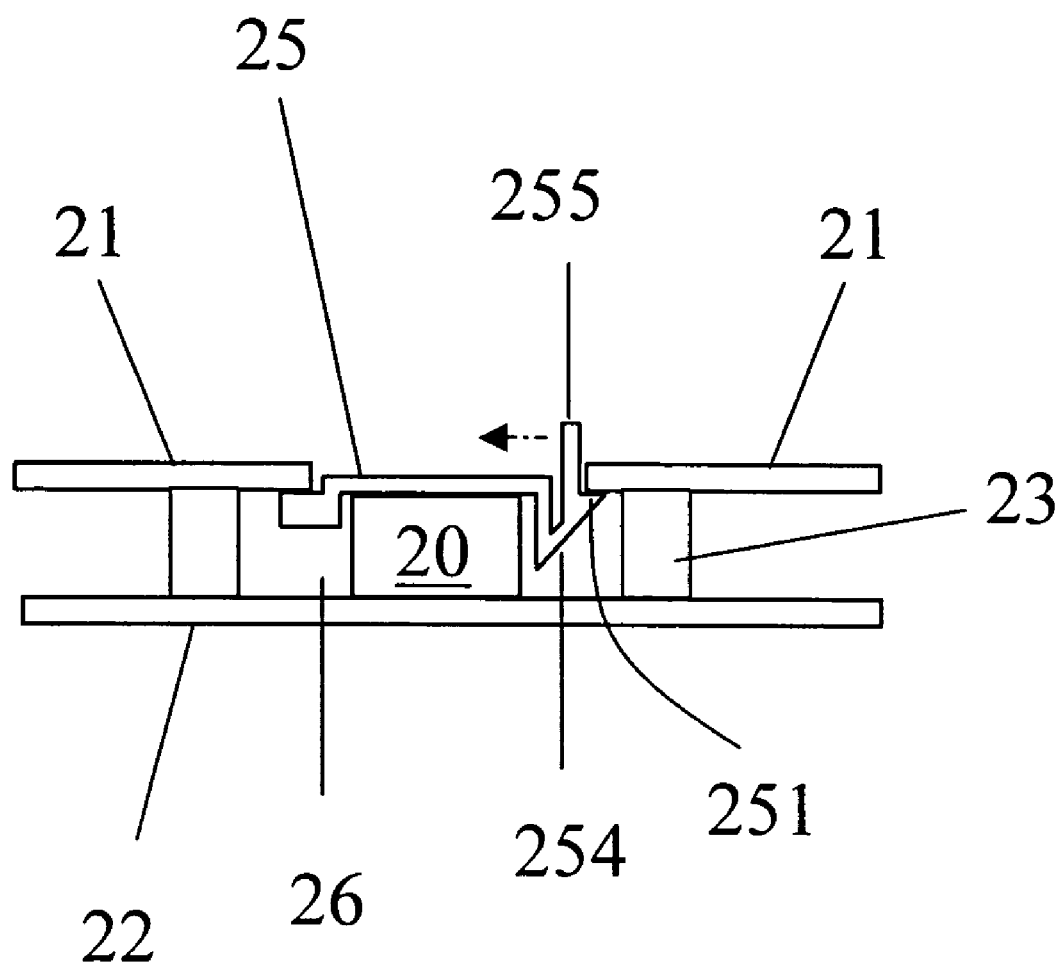
FIG. 4 shows how the cover of the clip latches to the LED module.

FIG. 4 shows the clip 25 being lowered to contact the top electrode of the LED 20. The right flange 251 is latched under the top metallic plate 21 at the step of the V-shaped cantilever 254. The latch is positioned by pushing the clip 25 against the space 26 to allow the V-shaped cantilever 254 to slide into the space 26 between the insulators 23 under the window 253. The clip 25 presses against the LED 20 to lock the LED 20 in place and to make electrical contact with the top electrode of the LED. Since the cover of the clip 25 is made of thin pliable metal sheet, the pressure exerted by the clip only causes soft landing of the LED 20 over the bottom plate 22.

When it is necessary to replace a defective or different color LED, one can push the handle 255 in the direction of the arrow as shown in FIG. 4 to release the latch back to the position shown in FIG. 3. After the LED 20 is replaced, one can relatch the clip 25 into the position shown in FIG. 4.

Figure 5:
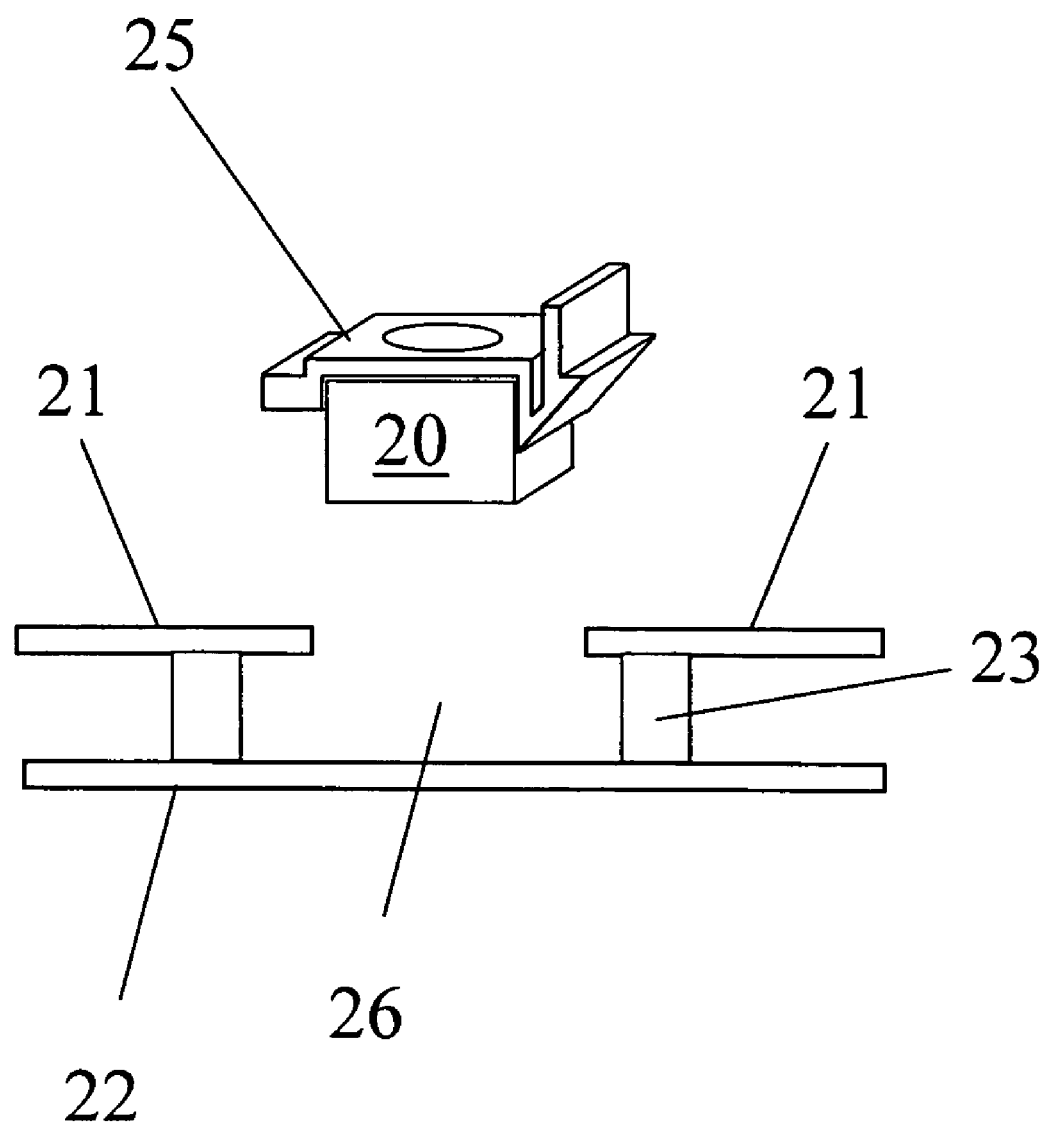
FIG. 5 shows another version of FIG. 3, wherein the LED is glued to the cover of the clip.

FIG. 5 shows a modification of FIG. 4. The LED 20 is glued to the clip 25 instead of lying over the bottom metal plate 22. Other reference numerals refer to the corresponding parts in FIG. 4.

Figure 6:
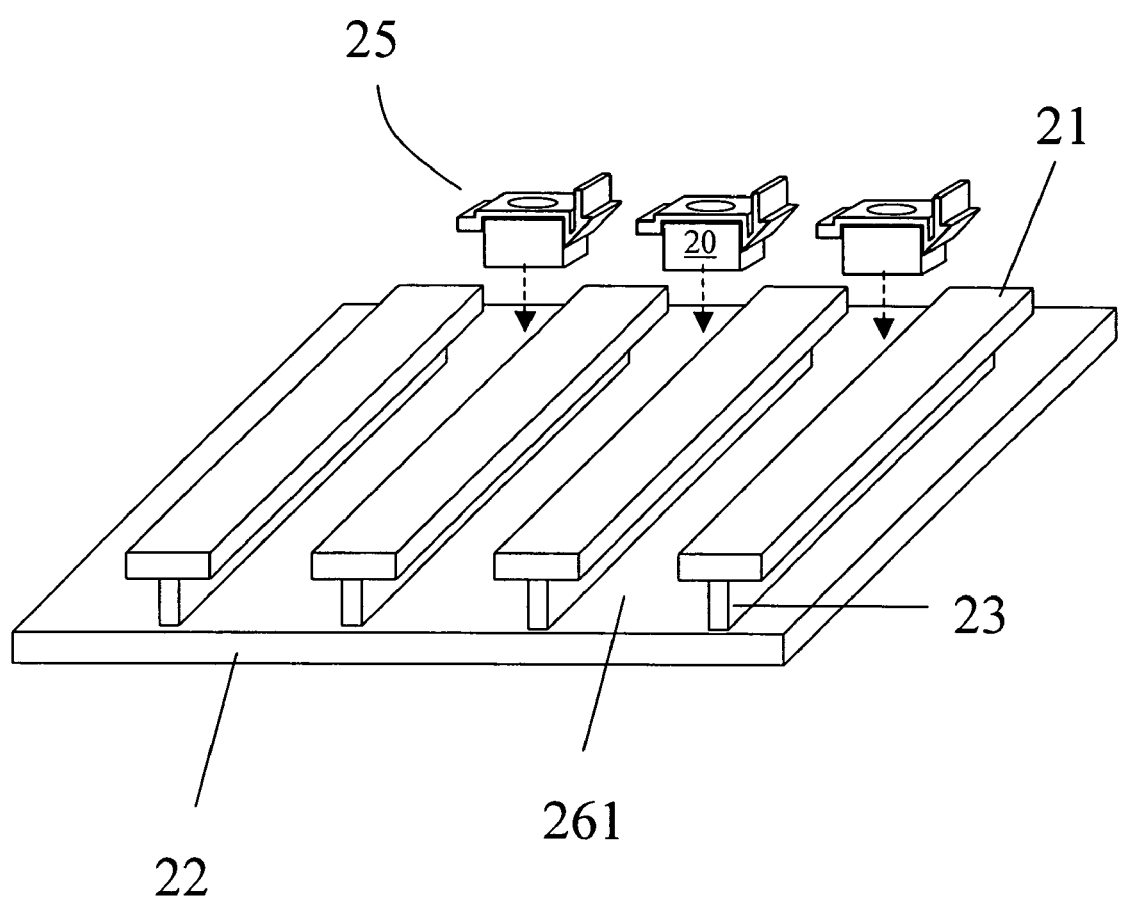
FIG. 6 shows a second embodiment of the present invention wherein an array of LEDs are clipped to a display panel.

FIG. 6 shows a second embodiment of the present invention. An array of the LED 20 and the clip 25 shown in FIG. 5 is mounted over a display panel 261. The LED modules are mounted over a common bottom plate 22 and latched between parallel rails of top metal plates 21, which is insulated from the bottom plates 22 by insulating spacers 23. The LED 20 with the clip 25 can be inserted in the space 26 uniformly or selectively to form specific patterns or characters so as to function as a commercial advertisement light board.

Figure 7:
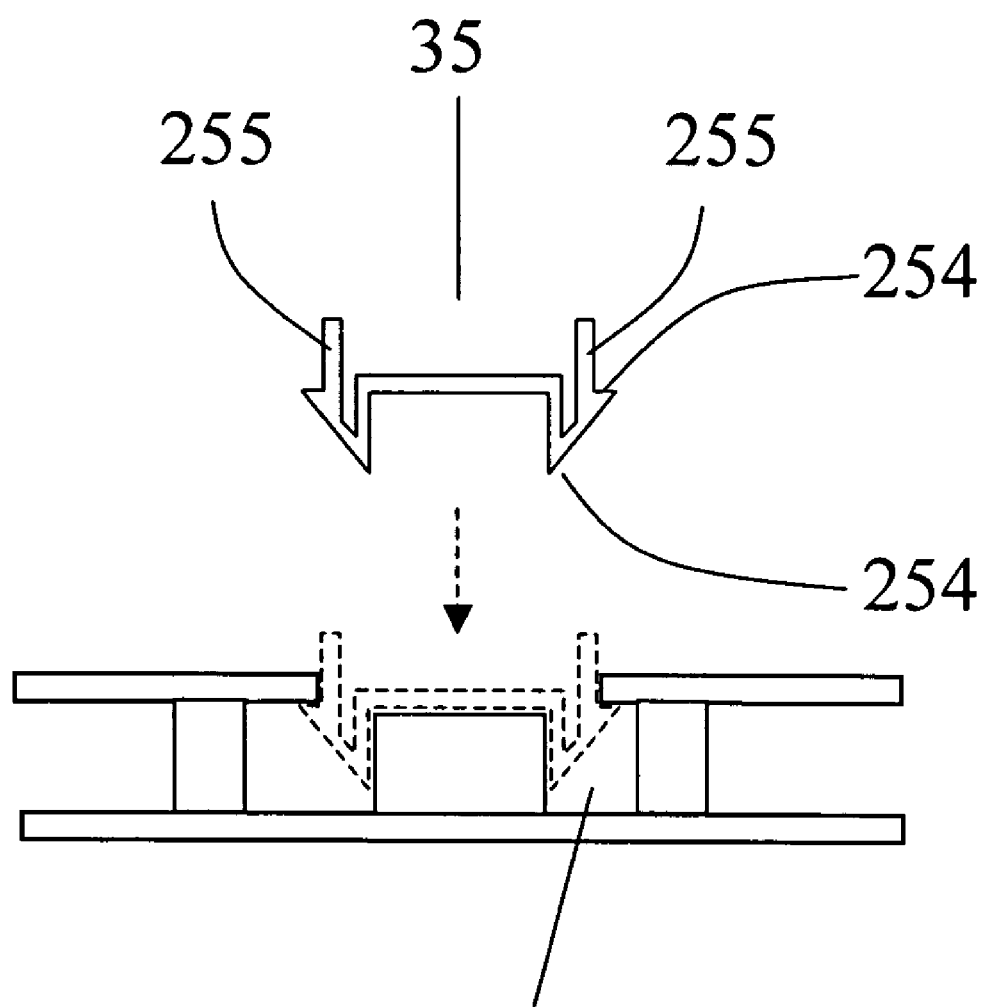
FIG. 7 shows a third embodiment of the present invention, wherein two latches are used to clip the LED in place.

FIG. 7 shows a third embodiment of the present invention. The clip 35 has two symmetrical flanges instead of a single flange shown in FIG. 2. Each cantilever flange has a handle 255. To latch the clip 25 for holding the LED 20 in place, the two handles are pushed toward each other for sliding the clip 25 over the LED 20. The other parts of the structure are the same as that in FIG. 4.

Figure 8:
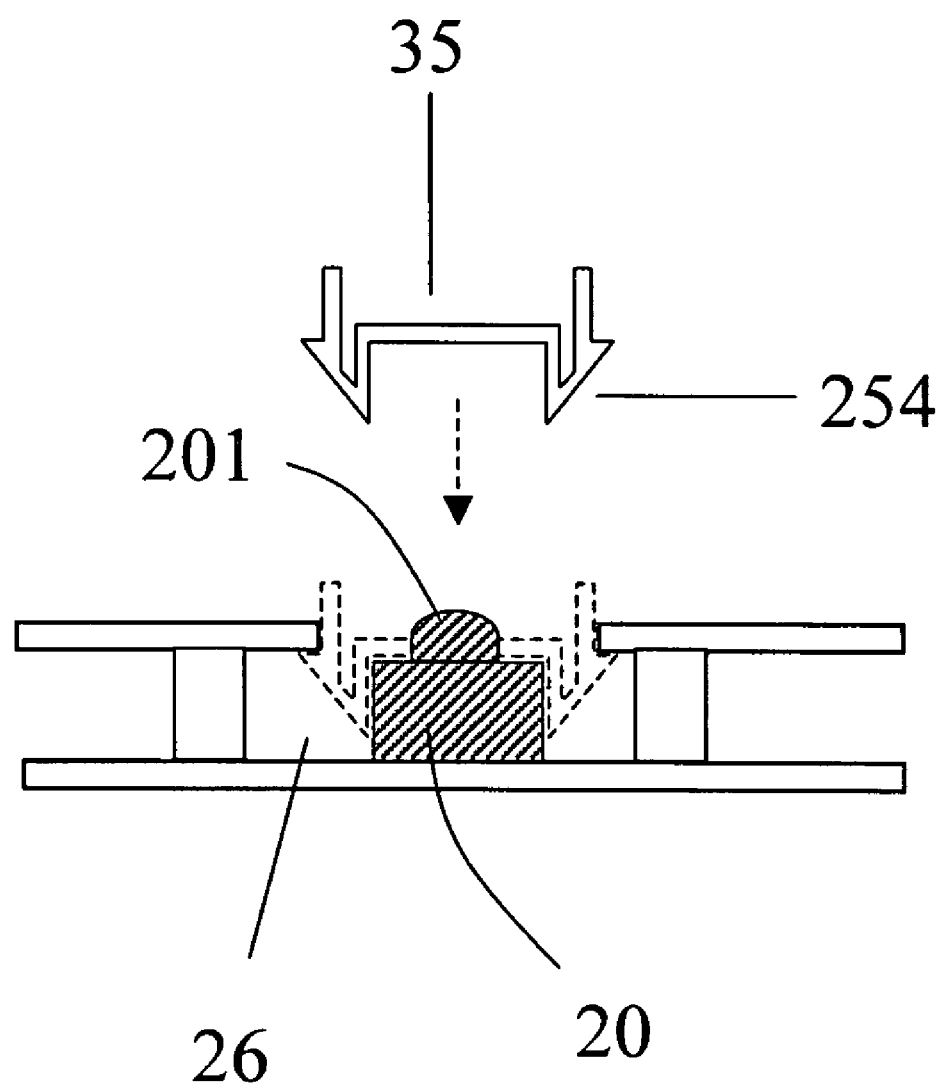
FIG. 8 shows a fourth embodiment of the present invention, wherein a lens is placed in front of the LED to diversify, to parallelize, or to focus the emitted light.

FIG. 8 shows a fourth embodiment of the present invention. A lens 201 is mounted over the LED 20 in the structure shown in FIG. 7. The lens can focus, parallelize, or diversify the light emitted from the LED 20.

Figure 9:
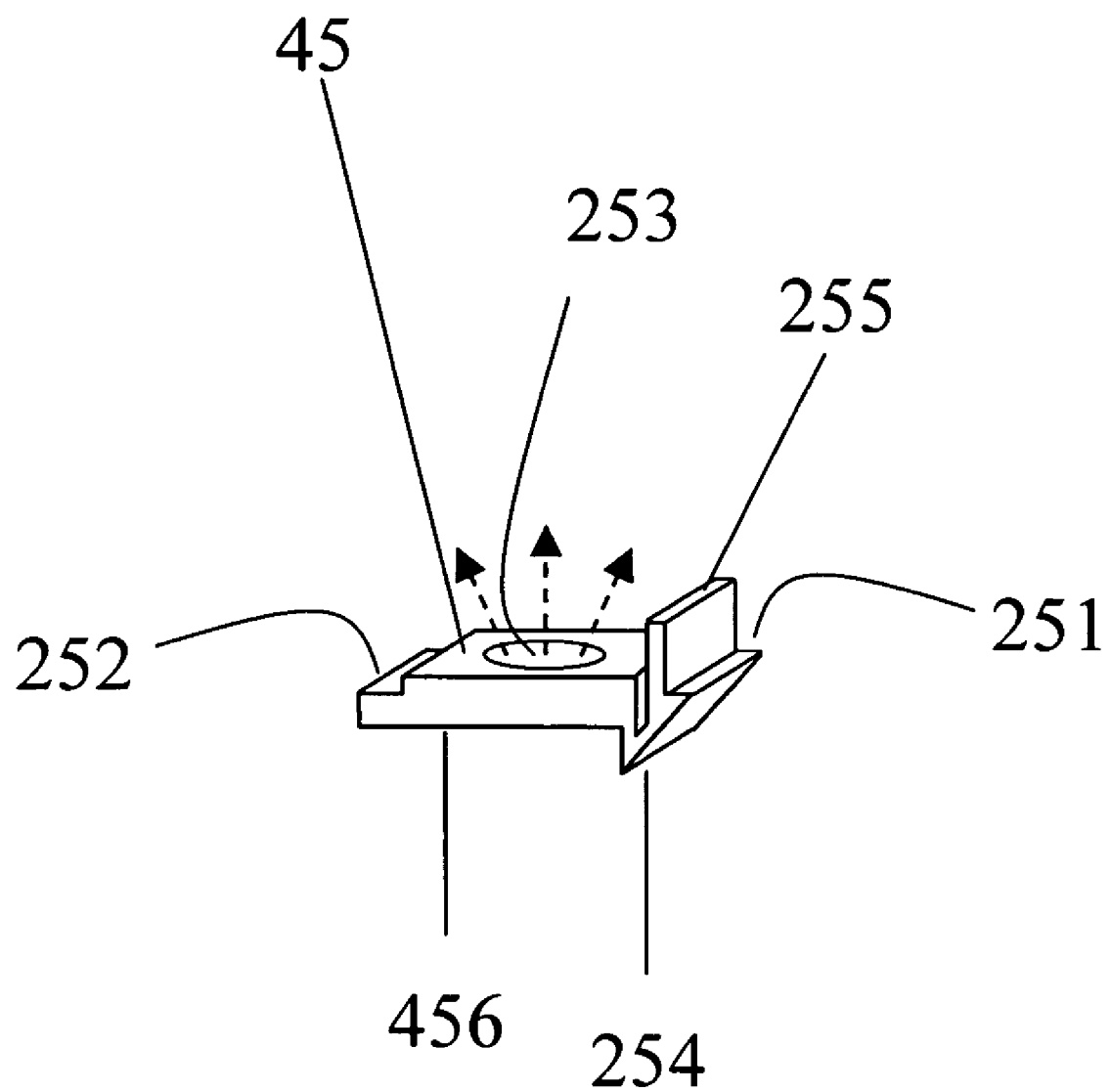
FIG. 9 shows a fifth embodiment of the present invention, wherein the bottom of the clip cover is of L-shape.

FIG. 9 shows a fifth embodiment of the present invention. Instead of the inverted U-shaped bottom groove 256 used in FIGS. 2–8, an L-shaped bottom plate 456 of the clip 45 is used.

For better electrical contacting, an elastic spring (not shown in the Figures) can be inserted between the LED and the cover 256 or between the LED and the lower metal plate 22.

While the preferred embodiments of the invention have been described, it will be apparent to those skilled in the art that various modifications can be made without departing from the spirit of this invention. Such modifications are all within the scope of this invention.

What is claimed is:

1. A replaceable light emitting diode (LED) module, comprising:
    a light emitting diode (LED) having a top electrode and a bottom electrode;
    a module for housing said LED, having a lower metal plate for electrical coupling to said bottom electrode, an upper metal plate with an opening, and insulating spacers between the lower metal plate and the upper metal plate; and
    a metal clip for pressing said LED against said lower metal plate and for electrical coupling to said top electrode,
    wherein said clip has a window for light emitted from said LED to transmit, and at least one releasable latch for latching said clip to said opening.

2. The replaceable LED module as described in claim 1, wherein said releasable latch has a V-shaped cantilever with a protruding handle, which forms a step with said cantilever and can be pushed toward the opening for sliding the cantilever below the edge of said top metal plate for latching the clip in position.

3. The replaceable LED module as described in claim 1, wherein said clip is a thin pliable metal sheet.

4. The replaceable LED module as described in claim 2, wherein said LED can be replaced when the clip is released.

5. The replaceable LED module as described in claim 1, wherein said LED is glued to said cover.

6. The replaceable LED module as described in claim 1, wherein the bottom of the cover is of inverted U-shape.

7. The replaceable LED module as described in claim 1, further comprising a plurality of said clip each covering a LED mounted over a common said lower metal plate, and a plurality of parallel said upper metal plate for latching said clips to form a lighting display.

8. The replaceable LED module as described in claim 2, wherein two of said cantilever are used to latch the clip in place.

9. The replaceable LED module as described in claim 8, wherein a lens is mounted over said LED to vary the angle of light emission.

10. The replaceable LED module as described in claim 1, wherein the bottom of the cover is of L-shape.

11. The replaceable LED module as described in claim 1, further comprising a spring inserted between the clip and the LED.

12. The replaceable LED module as described in claim 1, further comprising a spring inserted between the lower metal plate and the LED.

13. A replaceable laser diode module, comprising:
    a laser diode having a top electrode and a bottom electrode;
    a module for housing said laser diode, having a lower metal plate for electrical coupling to said bottom electrode, an upper metal plate with an opening, and insulating spacers between the lower metal plate and the upper metal plate; and
    a contacting clip for holding said laser diode in place and for electrical coupling to said top electrode,
    wherein said clip has a window for light emitted from said laser diode to transmit, and a cover for pressing said laser diode against said lower metal plate and having at least one releasable latch for latching said clip into said opening.

* * * * *